US011465244B2

(12) United States Patent
Tachibana et al.

(10) Patent No.: US 11,465,244 B2
(45) Date of Patent: Oct. 11, 2022

(54) SOLDER ALLOY, SOLDER BALL, CHIP SOLDER, SOLDER PASTE AND SOLDER JOINT

(71) Applicant: Senju Metal Industry Co., Ltd., Tokyo (JP)

(72) Inventors: Ken Tachibana, Chiba (JP); Takahiro Hattori, Tochigi (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 15/500,740

(22) PCT Filed: Feb. 15, 2016

(86) PCT No.: PCT/JP2016/054345
§ 371 (c)(1),
(2) Date: Jan. 31, 2017

(87) PCT Pub. No.: WO2016/189900
PCT Pub. Date: Dec. 1, 2016

(65) Prior Publication Data
US 2017/0216975 A1    Aug. 3, 2017

(30) Foreign Application Priority Data

May 26, 2015   (JP) .............................. JP2015-106315

(51) Int. Cl.
*B23K 35/26*       (2006.01)
*C22C 13/02*       (2006.01)
(Continued)

(52) U.S. Cl.
CPC ........ *B23K 35/262* (2013.01); *B23K 35/0244* (2013.01); *B23K 35/22* (2013.01);
(Continued)

(58) Field of Classification Search
CPC .. B23K 35/0244; B23K 35/262; C22C 13/00; H05K 3/3457
See application file for complete search history.

(56) References Cited

U.S. PATENT DOCUMENTS 6,365,097 B1    4/2002  Yamashita et al.
8,641,964 B2 *  2/2014  Lewis .................... C22C 13/00
                                                    420/557

(Continued)

FOREIGN PATENT DOCUMENTS

CN          1927525 A       3/2007
CN        101051535 A      10/2007
(Continued)

*Primary Examiner* — Erin B Saad
*Assistant Examiner* — Carlos J Gamino
(74) *Attorney, Agent, or Firm* — The Webb Law Firm (57) ABSTRACT

A solder alloy that contains 0.005 mass % or more and 0.1 mass % or less of Mn, 0.001 mass % or more and 0.1 mass % or less of Ge, and a balance of Sn. A plurality of Ge oxides is distributed on an outermost surface side of an oxide film including Sn oxide, Mn oxide and Ge oxide by adding 0.005 mass % or more and 0.1 mass % or less of Mn, 0.001 mass % or more and 0.1 mass % or less of Ge to the solder alloy having a principal ingredient of Sn, so that it is possible to obtain the discolor-inhibiting effect even under the high-temperature and high-humidity environment.

7 Claims, 2 Drawing Sheets

(51) Int. Cl.
*H05K 3/34* (2006.01)
*B23K 35/22* (2006.01)
*C22C 13/00* (2006.01)
*B23K 35/02* (2006.01)

(52) U.S. Cl.
CPC .............. *B23K 35/26* (2013.01); *C22C 13/00* (2013.01); *C22C 13/02* (2013.01); *H05K 3/34* (2013.01); *H05K 3/3457* (2013.01)

(56) References Cited

U.S. PATENT DOCUMENTS

| | | | | |
|---|---|---|---|---|
| 8,845,826 | B2* | 9/2014 | Kawamata | B23K 35/262 |
| | | | | 148/400 |
| 8,847,390 | B2 | 9/2014 | Hashino et al. | |
| 9,796,053 | B2 | 10/2017 | Fujimaki et al. | |
| 2002/0051728 | A1* | 5/2002 | Sato | B22F 1/0048 |
| | | | | 420/562 |
| 2003/0021718 | A1 | 1/2003 | Munekata et al. | |
| 2007/0134125 | A1* | 6/2007 | Liu | C22C 13/00 |
| | | | | 420/560 |
| 2007/0235207 | A1* | 10/2007 | Tsuji | C22C 13/00 |
| | | | | 174/68.1 |
| 2008/0061117 | A1* | 3/2008 | Munekata | B23K 1/0016 |
| | | | | 228/259 |
| 2008/0159904 | A1* | 7/2008 | Lewis | C22C 13/00 |
| | | | | 420/561 |
| 2010/0084050 | A1* | 4/2010 | Kraemer | B23K 35/262 |
| | | | | 148/23 |
| 2012/0038042 | A1 | 2/2012 | Sasaki et al. | |
| 2013/0175688 | A1 | 7/2013 | Lee et al. | |
| 2017/0197281 | A1* | 7/2017 | Choudhury | B23K 1/0016 |
| 2018/0102464 | A1* | 4/2018 | de Avila Ribas | H01L 33/62 |

FOREIGN PATENT DOCUMENTS

| | | |
|---|---|---|
| CN | 101072886 A | 11/2007 |
| CN | 101096730 A | 1/2008 |
| CN | 101569965 A | 11/2009 |
| CN | 104520062 A | 4/2015 |
| EP | 1273384 A1 | 1/2003 |
| JP | 200257177 A | 2/2002 |
| JP | 2002-248596 A | 3/2002 |
| JP | 2005103645 A | 4/2005 |
| JP | 2009506203 A | 2/2009 |
| JP | 2010247167 A | 11/2010 |
| JP | 201427122 A | 2/2014 |

* cited by examiner

SOLDER ALLOY, SOLDER BALL, CHIP SOLDER, SOLDER PASTE AND SOLDER JOINT

CROSS-REFERENCE TO RELATED APPLICATIONS

This application is the United States national phase of International Application No. PCT/JP2016/054345 filed Feb. 15, 2016, and claims priority to Japanese Patent Application No. 2015-106315 filed May 26, 2015, the disclosures of which are hereby incorporated in their entirety by reference.

TECHNICAL FIELD

The present invention relates to a solder alloy in which its discoloration is inhibited and deterioration of its wettability is prevented, as well as a solder ball, a chip solder, a solder paste and a solder joint, which use this solder alloy.

BACKGROUND

Since solder used for soldering electronic components on a printed circuit board generally has a principal ingredient of Sn, an oxide film of Sn oxide is formed on a surface of the solder by reacting $O_2$ in the air with Sn dependent to a storage condition before the use thereof. This tendency, in a case of its storage under a high temperature and high humidity environment, there may be a tendency such that thickness of the oxide film formed on its surface is increased, so that its surface is not glossy and it may discolor to yellow. When the oxide film remains on the surface of the solder, it is difficult to remove the oxide film by the flux in soldering, which deteriorates its wettability, so that its fusion property is degraded, which causes any failure to occur in the soldering.

On the other hand, recently, in association with miniaturization of information equipment, electronic components to be mounted on the information equipment have been thinned rapidly. A ball grid alley (hereinafter referred to as "BGA") having electrodes at its rear surface is applied to such electronic components in order to cope with narrowing of connection terminal and reduction of the mounting area because of the thinning requirement.

As the electronic components to which the BGA is applied, for example, a semiconductor package is exemplified. A solder bump is formed on each of the electrodes of the semiconductor package. This solder bump is formed by joining a solder ball, which is formed by making the solder alloy into a ball, to each electrode of the semiconductor package.

The semiconductor package to which the BGA is applied is put on a substrate with each solder bump being aligned to the electrode to which a solder paste is applied. By joining the solder paste melted by heating to the solder bump and the electrode of the substrate, the semiconductor package is mounted on the substrate.

In the solder ball having the principal ingredient of Sn, as described above, the oxide film of Sn oxide is formed on a surface of the solder ball by reacting $O_2$ in the air with Sn. When forming the oxide film on the surface of the solder ball, a phenomenon occurs such that the solder ball is not glossy and discolors to yellow. As appearance inspection of the solder ball, the discoloring of the surface of the solder ball may be utilized. When it is incapable of inhibiting the discoloration of the surface of the solder ball, there may be a strong possibility to determine that the solder ball is unsuitable for the use thereof.

Further, the flux is generally used when joining in order to remove an oxide film generated in the storage time or the like but when the oxide film is not sufficiently removed to remain on the surface of the solder, this deteriorates its wettability, so that its fusion property is degraded. A result of the degraded fusing property causes any failure to occur in the soldering as phenomenon.

Although it is conceivable to inhibit any growth of the oxide film on the surface of the solder ball by performing a strict management on the storage conditions, there are various kinds of storage conditions and all times there is a problem of the growth of the oxide film and the degradation of the fusion property according thereto. Therefore, it is required to be able to inhibit the growth of the oxide film on the surface of the solder ball, taking into consideration various kinds of the storage conditions. Although the explanation has been performed using an example of the solder ball, such a problem is a common problem to all the solder having the principal ingredient of Sn, regardless of the solder ball.

In order to solve such a problem, Ge has been generally added to the solder alloy having the principal ingredient of Sn (see Patent Document 1). This Patent Document 1 discloses a technology such that a total amount of 0.006 through 0.1 mass % of one or two or more species selected from a group of Ge, Ni, P, Mn, Au, Pd, Pt, S, Bi, Sb and In is added to a solder alloy including Sn, Ag and Cu in order to improve joining property by the soldering. It also discloses that Ge improve resistance to oxidation and Ni, P, Mn, Au, Pd, Pt, S, Bi, Sb and In have effects for lowering the melt point and enhancing the bond strength.

In addition, as quality required for the joining by the soldering, an appearance is also important in addition that the joining is surely performed. In the solder alloy having the principal ingredient of Sn, Sn oxide is formed by reacting $O_2$ in the air with Sn and covered as the oxide film on the surface of the solder alloy. Sn oxide discolors to yellow so that the surface of the solder alloy also discolors to yellow, so that the solder alloy may be determined as to be failure by the appearance inspection.

Accordingly, in order to alter optical properties of the surface of the oxide film, a technology has been proposed such that a total amount of 1 mass ppm or more and 0.1 mass % or less of one or two or more species selected from a group of Li, Na, K, Ca, Be, Mg, Sc, Y, lanthanoids, Ti, Zr, Hf, Nb, Ta, Mo, Zn, Al, Ga, In, Si and Mn is added to a solder alloy having the principal ingredient of Sn (see Patent Document 2).

Patent Document 1: Japanese Patent Application Publication No. 2005-103645

Patent Document 2: Japanese Patent Application Publication No. 2010-247167

SUMMARY OF THE INVENTION

Problem to be Solved by the Invention

As disclosed in the Patent Document 1, when Ge is added to the solder alloy having the principal ingredient of Sn, it is conceivable that the discoloration of the surface of the solder is inhibited under a high temperature environment. It, however, is impossible to inhibit the discoloration of the surface of the solder under a high-temperature and high-humidity environment even when Ge is added. Further, since wettability of the solder alloy having principal ingredient of Sn, to which Mn is added, is deteriorated, the Patent Document 1 does not disclose any addition of respective Ge and Mn in a case where a combination of them is added. Therefore, it does not assume the simultaneous addition of Ge and Mn.

Further, the Patent Document 2 discloses that when Mn is added to the solder alloy having the principal ingredient of Sn, the optical properties of the surface of the oxide film change, and even when the surface is oxidized to have the same thickness, its color tone changes so that it does not discolor to yellow. The solder alloy having the principal ingredient of Sn, to which Mn is added, does not inhibit the discoloration under the high temperature environment and the high temperature and high humidity environment and its wettability is also deteriorated.

As described above, neither the Patent Document 1 nor the Patent Document 2 disclose a combination of specified elements (Ge and Mn) among the disclosed elements, which obtains effects for inhibiting the discoloration and preventing the wettability from being deteriorated. Specifically, such effects cannot be obtained under the high temperature and high humidity environment.

The present invention resolves such a problem and has an object to provide a solder alloy in which its discoloration is inhibited and deterioration of its wettability is prevented, as well as a solder ball, a chip solder, a solder paste and a solder joint, which use this solder alloy.

Means for Solving the Problems

The invention allows the deterioration of wettability to be prevented and the discoloration to be inhibited, by adding predetermined amounts of both of Mn and Ge as the specified elements. It is made by finding out that Mn is easier to form the oxide as compared by Sn, the formation of Mn oxide can inhibit the growth of the oxide film generated by aging variation of Sn oxide and Ge oxide has a discolor-inhibiting effect.

Accordingly, the invention in clause 1 relates to a solder alloy containing 0.005 mass % or more and 0.1 mass % or less of Mn, 0.001 mass % or more and 0.1 mass % or less of Ge and a balance of Sn.

The invention in clause 2 is an invention according to clause 1 and relates to the solder alloy wherein an amount of Mn is smaller than or identical to an amount of Ge.

The invention in clause 3 is an invention according to Clause 1 or 2 and relates to the solder alloy further containing 0 mass % or more and 4 mass % or less of Ag, and more than 0 mass % and 1 mass % or less of Cu.

The invention in clause 4 is an invention according to Clause 3 and relates to the solder alloy containing more than 0 mass % and 4 mass % or less of Ag, and more than 0 mass % and 1 mass % or less of Cu.

The invention in clause 5 is an invention according to any one of clauses 1 through 4 andrelates to the solder alloy further containing a total amount of 0.002 mass % or more and 0.1 mass % or less of at least one species selected from a group of P and Ga.

The invention in clause 6 is an invention according to any one of clauses 1 through 5 and relates to the solder alloy further containing a total amount of 0.005 mass % or more and 0.3 mass % or less of at least one species selected from a group of Ni, Co and Fe.

The invention in clause 7 is an invention according to any one of clauses 1 through 6 and relates to the solder alloy further containing a total amount of 0.1 mass % or more and 10 mass % or less of at least one species selected from a group of Bi and In.

The invention in clause 8 relates to a solder ball obtained by using the solder alloy according to any one of clauses 1 through 7.

The invention in clause 9 relates to a chip solder obtained by using the solder alloy according to any one of clauses 1 through 7.

The invention in clause 10 relates to a solder paste obtained by using the solder alloy according to any one of clauses 1 through 7.

The invention in clause 11 relates to a solder joint obtained by using the solder alloy according to any one of clauses 1 through 7.

The invention in clause 12 relates to a solder joint obtained by using the solder ball according to clause 8.

The invention in clause 13 relates to a solder joint obtained by using the chip solder according to clause 9.

The invention in clause 14 relates to a solder joint obtained by using the solder paste according to clause 10.

Effect of the Invention

According to this invention, a plurality of Ge oxides is distributed on an outermost surface side of an oxide film including Sn oxide, Mn oxide and Ge oxide by adding 0.005 mass % or more and 0.1 mass % or less of Mn, 0.001 mass % or more and 0.1 mass % or less of Ge to a solder alloy having a principal ingredient of Sn, so that it is possible to obtain the discolor-inhibiting effect even under the high temperature and high humidity environment. Further, since a generation of Sn oxide is inhibited by adding Mn, an increase in thickness of oxide film is prevented, so that a fusion property can be improved.

DESCRIPTION OF THE INVENTION

In the solder alloy having the principal ingredient of Sn, Sn oxide ($SnO_x$) is generated on an outermost surface of the solder alloy, which causes its discoloration. This also causes its fusion property to be degraded.

On the other hand, in the solder alloy having the principal ingredient of Sn, to which Ge is added, it is possible to inhibit the discoloration under the high temperature environment by the discolor-inhibiting effect of Ge oxide ($GeO_z$) but it is impossible to inhibit its discoloration under the high temperature and high humidity environment, which also degrades the fusion property thereof.

By the way, it is known that Mn oxide is easier generated than Sn oxide according to a value of standard free energy of formation of its oxide. Therefore, in the solder alloy having the principal ingredient of Sn, to which Mn is added, a generation of Sn oxides is inhibited. The addition of Mn, however, does not obtain the discolor-inhibiting effect, so that it is impossible to inhibit the discoloration under the high temperature environment or the high temperature and high humidity environment.

On the other hand, it has been found that, in the solder alloy having the principal ingredient of Sn, to which predetermined amounts of Mn and Ge are added, the addition of Mn allows Ge oxides to be unevenly distributed to an outermost surface side of the oxide film. This allows Ge oxides ($GeO_z$), which has the discolor-inhibiting effect even under the high temperature and high humidity environment, to remain on the outermost surface side of the oxide film. In addition, the generation of Mn oxide ($Mn_aO_y$) also inhibits generation of Sn oxide. Therefore, it is possible to inhibit the discoloration thereof even under the high temperature and high humidity environment and inhibit the generation of Sn oxide, thereby improving the fusion property thereof.

As an amount of Mn for being capable of inhibiting the generation and growth of Sn oxide by reacting Mn with $O_2$ to preventing reacting Sn with $O_2$, 0.005 mass % or more and 0.1 mass % or less thereof is added. As an amount of Ge for being capable of allowing Ge oxides to remain on the outermost surface side of the oxide film, 0.001 mass % or more and 0.1 mass % or less thereof is added.

Accordingly, as described above, in the solder alloy according to this invention having the principal ingredient of Sn, to which the predetermined amounts of Mn and Ge are added, the Mn oxide ($Mn_aO_y$) inhibits the growth of Sn oxide to allow the Ge oxides, which have the discolor-inhibiting effect, to remain on the outermost surface side. This enables the discoloration to be inhibited even under the high temperature and high humidity environment, and the growth of oxide to be prevented, thereby improving the fusion property. This effect is obtained when predetermined amounts of Mn and Ge are added but even when other element(s) is (are) added, this effect is not lost. It, however, is preferable that as the elements other than Mn and Ge in the solder alloy, Sn is added to the solder alloy and the remainder may be configured to be only Sn.

Depending on intended uses, an additive element(s) is (are) optionally selectable. For example, when the solder alloy or the object to be jointed includes Cu, more than 0 mass % and 1 mass % or less of Cu may be added in order to suppresses the so-called copper leaching in which Cu is leached into the solder alloy. Further, in order to improve temperature cycle property thereof, more than 0 mass % and 4 mass % or less of Ag may be added. Ag precipitates network-like intermetallic compounds of $Ag_3Sn$ in a solder matrix and thus, has an effect to further improve its temperature cycle to form an alloy of precipitation strengthening type. It is to be noted that Ag may be omitted in a case of adding more than 0 mass % and 1 mass % or less of Cu. More than 0 mass % and 4 mass % or less of Ag may be also added in a case of adding more than 0 mass % and 1 mass % or less of Cu.

Additionally, as other elements, the following elements may be contained as optional components.

(a) A Total Amount of 0.002% Through 0.1% of at Least One Species Selected from a Group of P and Ga:

These elements have effects to improve wettability. A total amount of these elements thus contained is more preferably 0.003% through 0.01%. Although content of each element thus contained is not specifically limited, the content of P is preferably 0.002% through 0.005% and the content of Ga is preferably 0.002% through 0.02%.

(b) A Total Amount of 0.005% Through 0.3% of at Least One Species Selected from a Group of Ni, Co and Fe:

These elements suppress diffusing components of a plating layer applied to the semiconductor element or an external board into the solder alloy when soldering them. Accordingly, these elements have effects to maintain an organization of the solder alloy constituting the solder joint and to thin the film thickness of an intermetallic compound layer which is formed in a bonded interface. Therefore, these elements allow bond strength of the solder joint to be enhanced. A total amount of these elements thus contained is more preferably 0.01% through 0.05%. Although content of each element thus contained is not specifically limited, the content of Ni is preferably 0.02% through 0.07%, the content of Co is preferably 0.02% through 0.04% and the content of Fe is preferably 0.005% through 0.02%. Specifically, Ni among these elements is a preferable element as an element that demonstrates the effect as described above.

(c) A Total Amount of 0.1% Through 10% of at Least One Species Selected from a Group of Bi and in:

The addition of these elements allows the solder strength to be improved, which is expected to keep the reliability of the jointed portions. A total amount of these elements thus contained is more preferably 0.5% through 5.0%, especially particularly 0.8% through 4.5%. Although content of each element thus contained is not specifically limited, the content of Bi is preferably 0.5% through 5.0%, and the content of In is preferably 0.2% through 5.0%.

The following will describe a process of generating an oxide as follows, according to a study estimated at present. A Sn—Ag—Cu based solder alloy will be described as an example of the solder alloy having the principal ingredient of Sn.

(1) As for the Sn—Ag—Cu Based Solder Alloy Including Mn and Ge (Executed Examples)

In the Sn—Ag—Cu based solder alloy including Mn and Ge, at an initial state of the oxide generation, Sn, Mn and Ge in the solder alloy react with $O_2$ in the air to produce an oxide film composed of Sn oxide ($SnO_x$), Mn oxide ($Mn_aO_y$) and Ge oxide ($GeO_z$) on a surface of the solder alloy Sn.

When setting the solder alloy on which the oxide film has been thus formed at the initial state under a high temperature and high humidity environment in which a predetermined amount or more of $H_2O$ and $O_2$ exists, it is conceivable that a part of the oxide film composed of Sn oxide, Mn oxide and Ge oxide, which has formed on the outmost surface side of the solder alloy, is destroyed by $H_2O$ having high energy.

When the part of the oxide film is destroyed, based on a relationship between the values of the standard free energy of formation of Sn oxide and Mn oxide, the generation of Sn oxide is inhibited and Mn oxide is generated so that Mn oxides are almost evenly distributed along a thickness direction of the oxide film.

In addition, in the solder alloy having the principal ingredient of Sn, to which predetermined amounts of Mn and Ge are added, Sn oxides on the outermost surface side of the oxide film are decreased and Ge oxides are unevenly distributed to the outermost surface side of the oxide film.

From this, in the Sn—Ag—Cu based Solder Alloy including Mn and Ge, the generation of Sn oxide is inhibited and Ge oxides are unevenly distributed to the outermost surface side of the oxide film, thereby allowing the discoloration to be inhibited by the discolor-inhibiting effect of Ge oxides.

(2) Sn—Ag—Cu Based Solder Alloy Neither Including Mn Nor Ge (Comparison Examples)

In the Sn—Ag—Cu based solder alloy neither including Mn nor Ge, Sn in the solder alloy reacts with $O_2$ in the air at an initial state of the oxide generation to produce an oxide film composed of Sn oxide ($SnO_x$) on a surface of the solder alloy.

When exposing the solder alloy on which the oxide film is thus formed at the initial state under a high temperature environment or a high temperature and high humidity environment, it is conceivable that a part of the oxide film which has been formed on the surface thereof is destroyed, so that Sn in the solder alloy reacts with $O_2$ to further produce Sn oxide.

From this, in the Sn—Ag—Cu based Solder Alloy neither including Mn nor Ge, the Sn oxide causes the discoloration thereof.

(3) Sn—Ag—Cu Based Solder Alloy Including Mn but not Including Ge (Comparison Examples)

In the Sn—Ag—Cu based solder alloy including Mn but not including Ge, Sn and Mn in the solder alloy react with $O_2$ in the air at an initial state of the oxide generation to produce an oxide film composed of Sn oxide ($SnO_x$) and Mn oxide ($Mn_aO_y$) on a surface of the solder alloy.

When exposing the solder alloy on which the oxide film has been thus formed at the initial state under a high temperature environment or a high temperature and high humidity environment, it is conceivable that a part of the oxide film, which has been formed on the surface thereof is destroyed.

Based on the magnitudes of the standard free energy of formation of Sn oxide and Mn oxide, the generation of Sn oxide is inhibited and Mn oxide is generated.

Mn oxide, however, does not have any discolor-inhibiting effect and in the Sn—Ag—Cu based solder alloy including Mn but not including Ge, Mn oxide discolors similar to the Sn oxide, so that its discoloration cannot be inhibited.

(4) Sn—Ag—Cu Based Solder Alloy Including Ge but not Including Mn (Comparison Examples)

In the Sn—Ag—Cu based solder alloy including Ge but not including Mn, Sn and Ge in the solder alloy react with $O_2$ in the air at an initial state of the oxide generation to produce an oxide film composed of Sn oxide ($SnO_x$) and Ge oxide ($GeO_z$) on a surface of the solder alloy.

When exposing the solder alloy on which the oxide film has been thus formed at the initial state under a high temperature environment or a high temperature and high humidity environment, it is conceivable that a part of the oxide film, which has been formed on the surface thereof, is destroyed.

From this, in the Sn—Ag—Cu based Solder Alloy including Ge but not including Mn, the discoloration of the oxide film by the growth of Sn oxide cannot be inhibited.

Executed Examples

<Evaluation of Discolor-Inhibiting Effect>

The solder alloys of the executed examples and comparison examples having compositions shown in following Tables 1 and 2 were prepared and their discolor-inhibiting effects were evaluated. It is to be noted that a percent of each composition shown in Tables 1 and 2 is mass %.

The evaluation of discolor-inhibiting effect was performed according to the following procedure.

(1) Manufacture of Specimens

The prepared solder alloys were casted and rolled to make them plate materials. These plate members were punched out to be small pieces (each piece has a dimension of 2 mm (length), 2 mm (width) and 0.1 mm (thickness)) and they were manufactured as the specimens.

(2) Verification Method

Each specimen of the executed examples and comparison examples, thus manufactured above, was stored under a high temperature environment and a high temperature and high humidity environment and it was confirmed whether there is any discoloration. A storage condition was such that the specimen stayed in the high temperature and high humidity environment of temperature of 125 degrees C. and humidity RH of 100% for 24 hours. Under the high temperature leaving environment of temperature of 150 degrees C., the specimen was left for 7 days. The discoloration thereof was confirmed by using a DIGITAL MICROSCOPE VHX-500F made by KEYENCE. As a result of the confirmation, the one not showing any discoloration at all was evaluated as a double circle mark; the one confirming that a small amount of the gloss variation was evaluated as a circle mark; the one showing a little of the discoloration was evaluated as a triangle mark; and the one showing a discoloration was evaluated as a X-mark.

TABLE 1

|  | Sn | Ag | Cu | Ge | Mn | P | Ga | Ni | Co | Fe | Bi | In |
|---|---|---|---|---|---|---|---|---|---|---|---|---|
| EXECUTED EXAMPLE 1 | Bal. | 0 | 0 | 0.001 | 0.005 | | | | | | | |
| EXECUTED EXAMPLE 2 | Bal. | 0 | 0 | 0.001 | 0.04 | | | | | | | |
| EXECUTED EXAMPLE 3 | Bal. | 0 | 0 | 0.001 | 0.1 | | | | | | | |
| EXECUTED EXAMPLE 4 | Bal. | 0 | 0 | 0.05 | 0.005 | | | | | | | |
| EXECUTED EXAMPLE 5 | Bal. | 0 | 0 | 0.05 | 0.05 | | | | | | | |
| EXECUTED EXAMPLE 6 | Bal. | 0 | 0 | 0.05 | 0.1 | | | | | | | |
| EXECUTED EXAMPLE 7 | Bal. | 0 | 0 | 0.1 | 0.005 | | | | | | | |
| EXECUTED EXAMPLE 8 | Bal. | 0 | 0 | 0.1 | 0.05 | | | | | | | |
| EXECUTED EXAMPLE 9 | Bal. | 0 | 0 | 0.1 | 0.1 | | | | | | | |
| EXECUTED EXAMPLE 10 | Bal. | 0 | 0.5 | 0.001 | 0.005 | | | | | | | |
| EXECUTED EXAMPLE 11 | Bal. | 0 | 0.5 | 0.05 | 0.05 | | | | | | | |

TABLE 1-continued

| | | | | | | | | | | | | |
|---|---|---|---|---|---|---|---|---|---|---|---|---|
| EXECUTED EXAMPLE 12 | Bal. | 0 | 0.5 | 0.1 | 0.1 | | | | | | | |
| EXECUTED EXAMPLE 13 | Bal. | 0 | 1 | 0.05 | 0.05 | | | | | | | |
| EXECUTED EXAMPLE 14 | Bal. | 2 | 0.5 | 0.001 | 0.005 | | | | | | | |
| EXECUTED EXAMPLE 15 | Bal. | 2 | 0.5 | 0.05 | 0.05 | | | | | | | |
| EXECUTED EXAMPLE 16 | Bal. | 2 | 0.5 | 0.1 | 0.1 | | | | | | | |
| EXECUTED EXAMPLE 17 | Bal. | 4 | 1 | 0.05 | 0.05 | | | | | | | |
| EXECUTED EXAMPLE 18 | Bal. | 0 | 0 | 0.05 | 0.05 | 0.05 | | | | | | |
| EXECUTED EXAMPLE 19 | Bal. | 0 | 0 | 0.05 | 0.05 | | 0.05 | | | | | |
| EXECUTED EXAMPLE 20 | Bal. | 0 | 0 | 0.05 | 0.05 | | | 0.13 | | | | |
| EXECUTED EXAMPLE 21 | Bal. | 0 | 0 | 0.05 | 0.05 | | | | 0.11 | | | |
| EXECUTED EXAMPLE 22 | Bal. | 0 | 0 | 0.05 | 0.05 | | | | | 0.13 | | |
| EXECUTED EXAMPLE 23 | Bal. | 0 | 0 | 0.05 | 0.05 | | | | | | 3.1 | |
| EXECUTED EXAMPLE 24 | Bal. | 0 | 0 | 0.05 | 0.05 | | | | | | | 3.2 |
| EXECUTED EXAMPLE 25 | Bal. | 0 | 0.5 | 0.05 | 0.05 | 0.04 | | | | | | |
| EXECUTED EXAMPLE 26 | Bal. | 0 | 0.5 | 0.05 | 0.05 | | | 0.11 | | | | |
| EXECUTED EXAMPLE 27 | Bal. | 0 | 1 | 0.05 | 0.05 | | | | 0.10 | | | |
| EXECUTED EXAMPLE 28 | Bal. | 0 | 0.7 | 0.05 | 0.05 | | | | | | 3.0 | |
| EXECUTED EXAMPLE 29 | Bal. | 0 | 0.7 | 0.05 | 0.05 | | | | | | | 3.1 |
| EXECUTED EXAMPLE 30 | Bal. | 0 | 0 | 0.05 | 0.05 | 0.05 | 0.05 | 0.12 | 0.09 | 0.11 | 3.3 | 3.1 |
| EXECUTED EXAMPLE 31 | Bal. | 0 | 0.5 | 0.05 | 0.05 | 0.04 | 0.05 | 0.11 | 0.1 | 0.11 | 3.1 | 3.2 |

| | INITIAL STATE | HIGH TEMPERATURE/ HIGH HUMIDITY | HIGH TEMPERATURE LEAVING | WETTABILITY [mm2] | | INCIDENCE OF DEFECT FUSION [%] |
|---|---|---|---|---|---|---|
| | | | | Cu-OSP | Ni/Au | |
| EXECUTED EXAMPLE 1 | ◎ | ○ | ○ | 5.9 | 12.1 | 0 |
| EXECUTED EXAMPLE 2 | ◎ | ○ | ○ | 5.7 | 11.9 | 0 |
| EXECUTED EXAMPLE 3 | ◎ | ○ | ○ | 5.5 | 11.6 | 0 |
| EXECUTED EXAMPLE 4 | ◎ | ◎ | ◎ | 5.8 | 11.9 | 0 |
| EXECUTED EXAMPLE 5 | ◎ | ◎ | ◎ | 5.4 | 12.0 | 0 |
| EXECUTED EXAMPLE 6 | ◎ | ○ | ○ | 5.5 | 11.4 | 0 |
| EXECUTED EXAMPLE 7 | ◎ | ◎ | ◎ | 5.4 | 11.8 | 0 |
| EXECUTED EXAMPLE 8 | ◎ | ◎ | ◎ | 5.5 | 12.0 | 0 |
| EXECUTED EXAMPLE 9 | ◎ | ◎ | ◎ | 5.2 | 12.1 | 0 |
| EXECUTED EXAMPLE 10 | ◎ | ○ | ○ | 5.3 | 12.3 | 0 |
| EXECUTED EXAMPLE 11 | ◎ | ◎ | ◎ | 5.2 | 12.0 | 0 |
| EXECUTED EXAMPLE 12 | ◎ | ◎ | ◎ | 5.2 | 12.1 | 0 |
| EXECUTED EXAMPLE 13 | ◎ | ◎ | ◎ | 5.1 | 11.9 | 0 |
| EXECUTED EXAMPLE 14 | ◎ | ○ | ○ | 5.8 | 12.6 | 0 |
| EXECUTED EXAMPLE 15 | ◎ | ◎ | ◎ | 5.7 | 12.2 | 0 |
| EXECUTED EXAMPLE 16 | ◎ | ◎ | ◎ | 5.4 | 12.3 | 0 |

TABLE 1-continued

|  |  |  |  |  |  |  |
|---|---|---|---|---|---|---|
| EXECUTED EXAMPLE 17 | ◉ | ◉ | ◉ | 5.1 | 12.0 | 0 |
| EXECUTED EXAMPLE 18 | ◉ | ◉ | ◉ | 5.4 | 11.8 | 0 |
| EXECUTED EXAMPLE 19 | ◉ | ◉ | ◉ | 5.2 | 11.9 | 0 |
| EXECUTED EXAMPLE 20 | ◉ | ◉ | ◉ | 5.1 | 12.2 | 0 |
| EXECUTED EXAMPLE 21 | ◉ | ◉ | ◉ | 5.2 | 12.0 | 0 |
| EXECUTED EXAMPLE 22 | ◉ | ◉ | ◉ | 5.1 | 11.7 | 0 |
| EXECUTED EXAMPLE 23 | ◉ | ◉ | ◉ | 5.9 | 12.8 | 0 |
| EXECUTED EXAMPLE 24 | ◉ | ◉ | ◉ | 5.2 | 12.3 | 0 |
| EXECUTED EXAMPLE 25 | ◉ | ◉ | ◉ | 5.3 | 11.9 | 0 |
| EXECUTED EXAMPLE 26 | ◉ | ◉ | ◉ | 5.1 | 12.1 | 0 |
| EXECUTED EXAMPLE 27 | ◉ | ◉ | ◉ | 5.2 | 11.7 | 0 |
| EXECUTED EXAMPLE 28 | ◉ | ◉ | ◉ | 5.8 | 12.5 | 0 |
| EXECUTED EXAMPLE 29 | ◉ | ◉ | ◉ | 5.3 | 12.2 | 0 |
| EXECUTED EXAMPLE 30 | ◉ | ◉ | ◉ | 5.3 | 12.8 | 0 |
| EXECUTED EXAMPLE 31 | ◉ | ◉ | ◉ | 5.2 | 12.5 | 0 |

TABLE 2

|  | Sn | Ag | Cu | Ge | Mn | P | Ga | Ni | Co |
|---|---|---|---|---|---|---|---|---|---|
| COMPARISON EXAMPLE 1 | 100 | 0 | 0 | 0 | 0 |  |  |  |  |
| COMPARISON EXAMPLE 2 | Bal. | 1.0 | 0.7 | 0 | 0 |  |  |  |  |
| COMPARISON EXAMPLE 3 | Bal. | 0 | 0 | 0 | 0.005 |  |  |  |  |
| COMPARISON EXAMPLE 4 | Bal. | 0 | 0 | 0 | 0.06 |  |  |  |  |
| COMPARISON EXAMPLE 5 | Bal. | 0 | 0 | 0 | 0.1 |  |  |  |  |
| COMPARISON EXAMPLE 6 | Bal. | 0 | 0 | 0 | 0.14 |  |  |  |  |
| COMPARISON EXAMPLE 7 | Bal. | 0 | 0 | 0 | 0.19 |  |  |  |  |
| COMPARISON EXAMPLE 8 | Bal. | 0 | 0 | 0.001 | 0 |  |  |  |  |
| COMPARISON EXAMPLE 9 | Bal. | 0 | 0 | 0.001 | 0.14 |  |  |  |  |
| COMPARISON EXAMPLE 10 | Bal. | 0 | 0 | 0.05 | 0 |  |  |  |  |
| COMPARISON EXAMPLE 11 | Bal. | 0 | 0 | 0.05 | 0.15 |  |  |  |  |
| COMPARISON EXAMPLE 12 | Bal. | 0 | 0 | 0.1 | 0 |  |  |  |  |
| COMPARISON EXAMPLE 13 | Bal. | 0 | 0 | 0.1 | 0.15 |  |  |  |  |
| COMPARISON EXAMPLE 14 | Bal. | 0 | 0 | 0.15 | 0.005 |  |  |  |  |
| COMPARISON EXAMPLE 15 | Bal. | 0 | 0 | 0.15 | 0.05 |  |  |  |  |
| COMPARISON EXAMPLE 16 | Bal. | 0 | 0 | 0.15 | 0.1 |  |  |  |  |
| COMPARISON EXAMPLE 17 | Bal. | 0 | 0 | 0.15 | 0.15 |  |  |  |  |
| COMPARISON EXAMPLE 18 | Bal. | 2 | 0.5 | 0.15 | 0.15 |  |  |  |  |

|  |  |  |  | INITIAL STATE | HIGH TEMPERATURE/ HIGH HUMIDITY | HIGH TEMPERATURE LEAVING | WETTABILITY [mm2] | | INCIDENCE OF DEFECT FUSION[%] |
|---|---|---|---|---|---|---|---|---|---|
|  | Fe | Bi | In |  |  |  | Cu-OSP | Ni/Au |  |
| COMPARISON EXAMPLE 1 |  |  |  | ◉ | X | X | 3.9 | 10.1 | 24.4 |
| COMPARISON EXAMPLE 2 |  |  |  | ◉ | X | X | 4.2 | 10.8 | 15.6 |
| COMPARISON EXAMPLE 3 |  |  |  | ◉ | X | X | 4.6 | 10.5 | 20.0 |
| COMPARISON EXAMPLE 4 |  |  |  | ◉ | X | X | 4.5 | 10.5 | 11.1 |
| COMPARISON EXAMPLE 5 |  |  |  | ◉ | X | X | 4.4 | 10.3 | 13.3 |
| COMPARISON EXAMPLE 6 |  |  |  | ◉ | X | X | 4.1 | 10 | 26.7 |
| COMPARISON EXAMPLE 7 |  |  |  | ◉ | X | X | 4.1 | 10.3 | 31.1 |
| COMPARISON EXAMPLE 8 |  |  |  | ◉ | X | Δ | 4.3 | 10.4 | 17.8 |
| COMPARISON EXAMPLE 9 |  |  |  | ◉ | ○ | ○ | 4.7 | 10.2 | 6.67 |
| COMPARISON EXAMPLE 10 |  |  |  | ◉ | X | ◉ | 4.4 | 10.8 | 26.7 |
| COMPARISON EXAMPLE 11 |  |  |  | ◉ | ◉ | ◉ | 4.6 | 11.1 | 11.1 |
| COMPARISON EXAMPLE 12 |  |  |  | ◉ | X | ◉ | 4.5 | 10.9 | 15.6 |
| COMPARISON EXAMPLE 13 |  |  |  | ◉ | ◉ | ◉ | 4.2 | 10.7 | 6.67 |
| COMPARISON EXAMPLE 14 |  |  |  | ◉ | ◉ | ◉ | 4.2 | 10.8 | 6.67 |

TABLE 2-continued

| | | | | | | |
|---|---|---|---|---|---|---|
| COMPARISON EXAMPLE 15 | ◎ | ◎ | ◎ | 4.3 | 10.8 | 11.1 |
| COMPARISON EXAMPLE 16 | ◎ | ◎ | ◎ | 4.3 | 10.3 | 13.3 |
| COMPARISON EXAMPLE 17 | ◎ | ◎ | ◎ | 4.0 | 10.1 | 17.8 |
| COMPARISON EXAMPLE 18 | ◎ | ◎ | ◎ | 4.4 | 10.6 | 20.0 |

As shown in Tables 1 and 2, in the initial state, neither the executed examples nor the comparison examples showed any discoloration. In the executed examples 4, 7 and 8 in which Mn and Ge were added and a ratio of an added amount of Mn was smaller than that of Ge, any discoloration was not shown at all under the high temperature leaving environment and the high temperature and high humidity environment. In the executed examples 5, 9, 11-13, and 15-17 in which a ratio of an added amount of Mn was similar to that of Ge, any discoloration similarly was not shown at all under the high temperature leaving environment and the high temperature and high humidity environment. In the executed examples 1, 2, 3, 6, 10 and 14 in which a ratio of an added amount of Ge was smaller than that of Mn, it was confirmed under the high temperature leaving environment and the high temperature and high humidity environment that a small amount of the gloss thereof altered.

In the executed examples 10 through 17 in which Mn and Ge were added and only Cu or both of Ag and Cu were added, any discoloration was not shown under the high temperature leaving environment and the high temperature and high humidity environment.

In the executed examples 18 through 31 in which Mn and Ge were added, a ratio of an added amount of Mn was similar to that of Ge and any or all of P, Ga, Ni, Co, Fe, Bi and In were added, any discoloration was not shown at all under the high temperature leaving environment and the high temperature and high humidity environment.

On the other hand, in the comparison examples 1 and 2 in which Mn and Ge were not added, a discoloration was shown under the high temperature leaving environment and the high temperature and high humidity environment. In the comparison examples 3 through 7 in which Mn was added but Ge was not added, a discoloration was similarly shown under the high temperature leaving environment and the high temperature and high humidity environment. In the comparison examples 8, 10 and 12 in which Ge was added but Mn was not added, a discolor-inhibiting effect was obtained under the high temperature leaving environment by increasing the added amount of Ge but a discoloration was shown under the high temperature and high humidity environment. In the comparison examples 9, 11 and 13 through 18 in which Mn and Ge were added, it was confirmed that a small amount of the gloss variation in the comparison example 9 but any discoloration was not shown at all under the high temperature leaving environment and the high temperature and high humidity environment in the comparison examples 11 and 13 through 18, even when any or both of Mn and Ge were excessively added beyond a scope of this invention.

From the above results, it is understood that the discolor-inhibiting effect is obtained under the high temperature leaving environment and the high temperature and high humidity environment by adding Mn and Ge into a solder alloy containing the principal ingredient of Sn. When the ratio of an added amount of Mn was smaller than or similar to that of Ge, it is also understood that the better discolor-inhibiting effect is obtained.

<Distribution of Oxides>

Next, a distribution of Sn oxides, Mn oxides and Ge oxides in an oxide film about the solder alloys of the executed examples, the discolor-inhibiting effect of which had been verified under the high temperature leaving environment and the high temperature and high humidity environment as shown in Table 1 described above, was verified.

Figure 1:
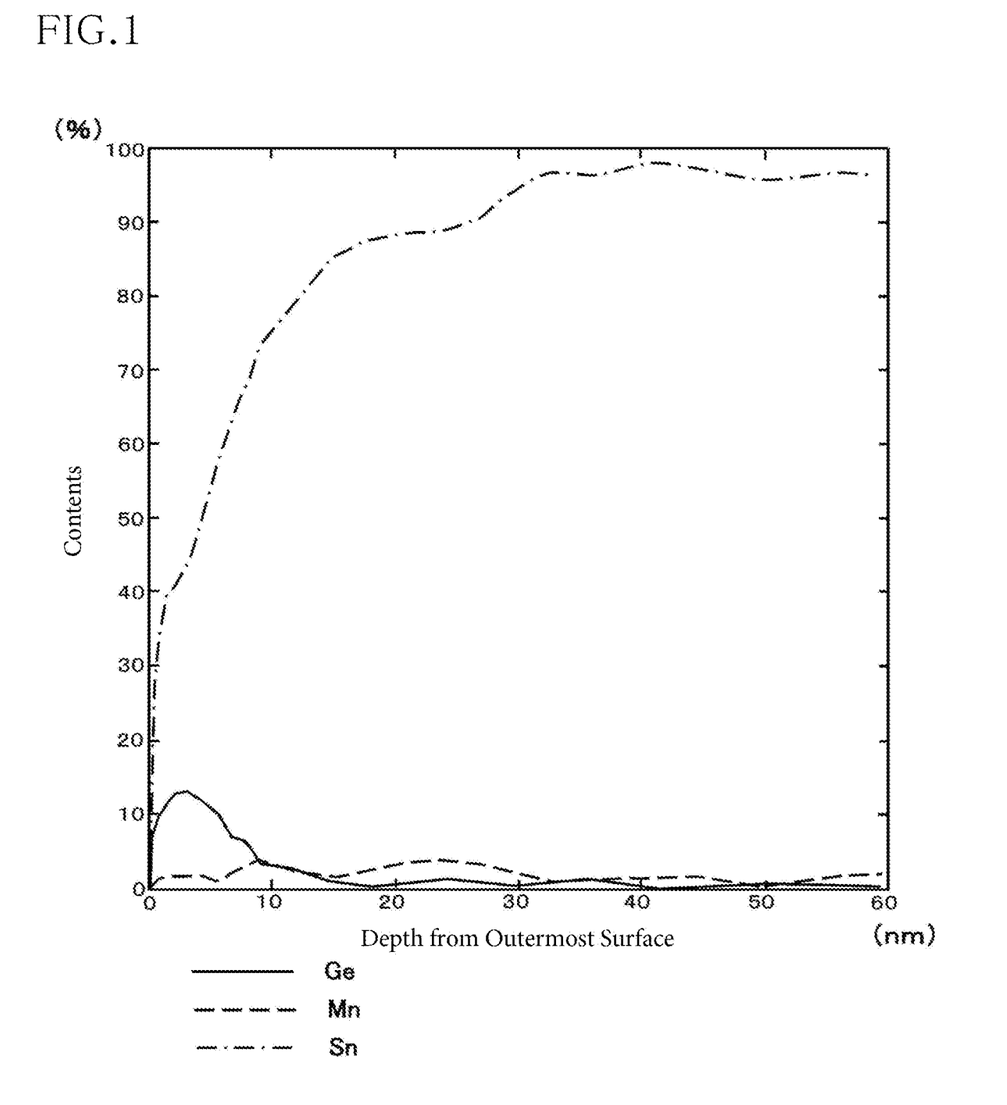
FIG. 1 is a graph showing a distribution of oxides in Sn—Ag—Cu based solder alloy including Mn and Ge.

FIG. 1 shows the distribution of major elements in a case of containing a principal ingredient of Sn and including Mn and Ge. In a graph of FIG. 1, a vertical axis indicates their contents and a horizontal axis indicates a depth from an outermost surface in which the elements are distributed. Any other contained elements such as oxygen and carbon are not shown therein.

It is understood that in the executed example 1 containing a principal ingredient of Sn and including Mn and Ge, many of Ge oxides are distributed in a range of about 10 nm from the outermost surface of the oxide film and many of Ge oxides are also distributed at an outermost surface side of the oxide film. Further, it is understood that Mn is almost even distributed from the outermost surface thereof. On the other hand, it is understood that Sn is decreased in the outermost surface thereof. In even cases of the executed examples 2 through 31 in which the added amounts of Mn and Ge alter, an identical distribution is shown.

From the distribution of elements shown in FIG. 1, it is understood that in the solder alloys each containing a principal ingredient of Sn and to which predetermined amounts of Mn and Ge are added, Ge oxides are distributed while they are unevenly distributed to the outermost surface side of the oxide film and Sn oxides are inhibited from being formed at the outermost surface thereof.

Thus, the distribution of many of Ge oxides having the discolor-inhibiting effect at the outermost surface side allows inhibiting the discoloration. Further, the almost even distribution of Mn oxides along a thickness direction of the oxide film allows inhibiting the generation of Sn oxides.

<Evaluation of Fusion Property>

Fusion properties about the solder alloys of the executed examples and the comparison examples, the discolor-inhibiting effect of which had been verified under the high temperature leaving environment and the high temperature and high humidity environment as shown in Tables 1 and 2 described above, were verified. A method for verifying them was such that the prepared solder alloys having compositions of the executed examples and the comparison examples were casted and rolled and they were punched out to be made small pieces (each piece has a dimension of 2 mm (length), 2 mm (width) and 0.1 mm (thickness)). These small pieces were formed as plate materials having a predetermined dimension. They were put on a Cu plate on which organic solderability preservative (OSP) processing (water-soluble preflux processing) was performed and flux was applied and reflowed, and then the surface thereof was washed and they stayed under an environment of temperature of 125 degrees C. and humidity RH of 100% for 24 hours. Further, the solder balls (in a case of this embodiment, a diameter thereof is 300 μm) which were manufactured by using the solder alloy in which 3.0 mass % of Ag, 0.5 mass % of Cu and the balance of Sn (Sn-3.0Ag-0.5Cu) were contained stayed under an environment of temperature of 125 degrees C. and humidity RH of 100% for 24 hours, which was similar to the small pieces. Next, flux was applied to the specimens made of the solder alloys of the executed examples or the comparison examples and a predetermined number of solder balls was put thereon. In the examples, the number of solder balls was set to be nine pieces and respective 5 plate materials were prepared. Then, after reflowing was performed, a number of defectively fused solder balls was calculated and incidence of defect fusion was calculated. The term, "defect fusion" is referred to as a condition in which the Cu plate and the solder balls are not jointed to each other.

In the executed examples 1 through 31 containing a principal ingredient of Sn and including Mn and Ge, the incidence of defect fusion of zero was shown.

In all of the comparison examples 1 and 2 containing a principal ingredient of Sn and excluding Mn and Ge, the comparison examples 3 through 7 containing a principal ingredient of Sn, including Mn and excluding Ge, and the comparison examples 8, 10 and 12 containing a principal ingredient of Sn, including Ge and excluding Mn, the defect fusion occurred. Further, in the comparison examples 9, 11 and 13 to which an amount of Mn exceeding the range of this invention was excessively added, among the comparison examples 9, 11 and 13 through 18 to which Mn and Ge were added, the defect fusion occurred. In the comparison examples 14 through 18 to which an amount of Ge or both of Ge and Mn was excessively added within the range of this invention, the defect fusion occurred.

<Evaluation of Wettability>

Wettability about each of the solder alloys of the executed examples and the comparison examples, the discolor-inhibiting effect of which had been verified under the high temperature leaving environment and the high temperature and high humidity environment as shown in Tables 1 and 2 described above, was verified. A method for verifying it was such that the prepared solder alloys having compositions of the executed examples and the comparison examples were casted and rolled and they were punched out to be made small pieces (each piece has a dimension of 2 mm (length), 2 mm (width) and 0.1 mm (thickness)). These small pieces stayed under an environment of temperature of 125 degrees C. and humidity RH of 100% for 24 hours. Next, the flux was applied to each of the OSP processed Cu plates and Ni/Au plating plates in which Ni was plated on the Cu plate and Au was plated on the Ni plated plate. The small pieces, on which the high temperature and high humidity process had been performed, were put thereon and reflowed. An area in which the solder alloy was spread was measured and the OSP processed Cu plate in which 5.0 mm$^2$ thereof was spread was fixed to be passed or the Ni/Au plating plate in which 11.0 mm$^2$ thereof was spread was fixed to be passed.

In the executed examples 1 through 31 containing a principal ingredient of Sn and including Mn and Ge, any deterioration was not seen in the wettability to the OSP processed Cu plates, nor in the wettability to the Ni/Au plating plate.

In the comparison examples 3 through 7 in which Mn was contained but Ge was not contained, both of the wettability to the OSP processed Cu plates and the wettability to the Ni/Au plating plate were deteriorated when an added amount of Mn was increased. In any of the comparison examples 9, 11 and 13 to which an amount of Mn exceeding the range of this invention was excessively added, or the comparison examples 14 through 18 to which an amount of Ge or both of Mn and Ge exceeding the range of this invention was excessively added, among the comparison examples 9, 11 and 13 through 18 to which Mn and Ge were added, both of the wettability to the OSP processed Cu plates and the wettability to the Ni/Au plating plate were deteriorated. When an amount of Ge or Mn exceeding the range of this invention is excessively added, it is understood that the wettability is deteriorated.

From the above results, it is understood that, in the solder alloy containing a principal ingredient of Sn, to which 0.005 mass % or more and 0.1 mass % or less of Mn and 0.001 mass % or more and 0.1 mass % or less of Ge are added, Mn and $O_2$ are reacted to prevent Sn from reacting with $O_2$, which inhibits the distribution of Sn oxides to the outermost surface of the oxide film by aging variation, so that since the oxide film containing Ge oxides having the discolor-inhibiting effect remains in the outermost surface side thereof, the discolor-inhibiting effect can be obtained even under the high temperature and high humidity environment. It is understood that when the ratio of the added amount of Mn and Ge is preferably set so that the added amount of Mn is smaller and identical to that of Ge, the more excellent discolor-inhibiting effect can be obtained even under the high temperature and high humidity environment and the high temperature leaving environment.

It is understood that, in the solder alloy containing a principal ingredient of Sn, to which the above predetermined amounts of Mn and Ge are added, Mn and $O_2$ are reacted to prevent Sn from reacting with $O_2$, which inhibits the growth of Sn oxides, so that an increase in the thickness of the oxide film can be prevented. The prevention of an increase in the thickness of the oxide film allows the oxide to be satisfactorily removed by the flux in the soldering, thereby improving the fusion property thereof.

<Application Examples of Solder Alloy>

Figure 2:
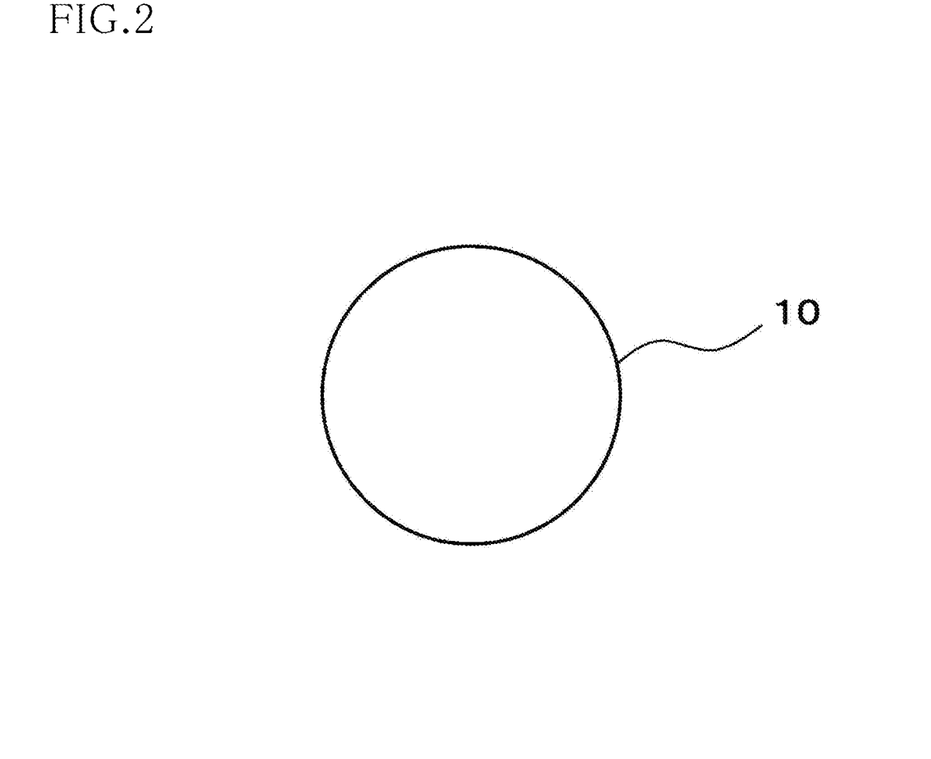
FIG. 2 is a diagram showing an application example of the solder alloy according to this invention.

FIG. 2 is a diagram showing an application example of the solder alloy according to this invention. The solder alloy containing a principal ingredient of Sn, to which 0.005 mass % or more and 0.1 mass % or less of Mn and 0.001 mass % or more and 0.1 mass % or less of Ge are added, may be formed as a solder ball 10. It is preferable that a diameter of the solder ball 10 is 1 through 1000 µm. Within this range, the solder ball can be stably manufactured so that a short-circuit in the connection can be inhibited in a case where the terminals have a narrow pitch between them. Here, when each of the solder balls has the diameter of about 1 through 50 µm, these solder balls may be referred to as "solder powder".

Figure 3:
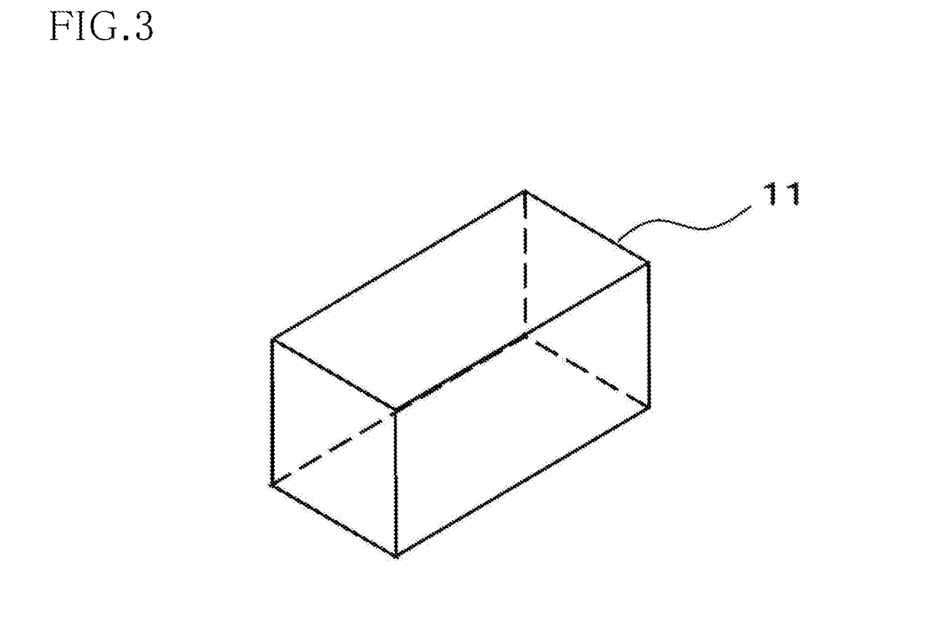
FIG. 3 is a diagram showing another application example of the solder alloy according to this invention.

FIG. 3 is a diagram showing another application example of the solder alloy according to this invention. The solder alloy containing a principal ingredient of Sn, to which 0.005 mass % or more and 0.1 mass % or less of Mn and 0.001 mass % or more and 0.1 mass % or less of Ge are added, may be applied as a chip solder 11. The chip solder 11 is formed so as to have a rectangular parallelepiped shape, for example.

As other application example thereof, a solder paste may be exemplified in which the powdered solder alloy having a predetermined dimension and containing a principal ingredient of Sn, to which 0.005 mass % or more and 0.1 mass % or less of Mn and 0.001 mass % or more and 0.1 mass % or less of Ge are added, is mixed with the flux.

The solder alloy, the solder ball, the chip solder and the solder paste according to the invention are formed as a solder joint which is used for joining a semiconductor chip with them or joining the printed circuit board with electronic components.

α dose of the present invention may be 0.0200 cph/cm$_2$ or less. When α dose is 0.0200 cph/cm$_2$ or less, any software error in electronic device can be inhibited.

The invention claimed is:

1. A solder alloy, consisting of:
0.005 mass % or more and 0.1 mass % or less of Mn;
0.05 mass % or more and 0.1 mass % or less of Ge;
optionally one or more of:
   0 mass % or more and 1 mass % or less of Cu;
   0 mass % or more and 4 mass % or less of Ag;
   0.002 mass % or more and 0.1 mass % or less of Ga;
   0.02 mass % or more and 0.3 mass % or less of Ni;
   at least one species selected from a group of Co and Fe, wherein a total amount of Ni, Co, and Fe is 0.02 mass % or more and 0.3 mass % or less; and
   a total amount of 0.1 mass % or more and 10 mass % or less of at least one species selected from a group of Bi and In; and
a balance of Sn,
wherein the amount of Mn is smaller than or identical to the amount of Ge.

2. The solder alloy according to claim 1, wherein the solder alloy includes:
0 mass % or more and 4 mass % or less of Ag; and
more than 0 mass % and 1 mass % or less of Cu.

3. The solder alloy according to claim 1, wherein the solder alloy includes:
more than 0 mass % and 4 mass % or less of Ag; and
more than 0 mass % and 1 mass % or less of Cu.

4. The solder alloy according to claim 1, wherein the solder alloy includes 0.003 mass % or more and 0.01 mass % or less of Ga.

5. The solder alloy according to claim 1, wherein the solder alloy includes a total amount of 0.5 mass % or more and 5.0 mass % or less of at least one species selected from a group of Bi and In.

6. The solder alloy according to claim 3, wherein the solder alloy includes 0.003 mass % or more and 0.01 mass % or less of Ga.

7. The solder alloy according to claim 3, wherein the solder alloy includes a total amount of 0.5 mass % or more and 5.0 mass % or less of at least one species selected from a group of Bi and In.

\* \* \* \* \*